(12) United States Patent
Beylkin et al.

(10) Patent No.: US 10,838,296 B2
(45) Date of Patent: Nov. 17, 2020

(54) MASK OPTIMIZATION PROCESS

(71) Applicant: Taiwan Semiconductor Manufacturing Co., Ltd., Hsinchu (TW)

(72) Inventors: Daniel Beylkin, San Jose, CA (US); Sagar Vinodbhai Trivedi, San Jose, CA (US)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 331 days.

(21) Appl. No.: 16/010,782

(22) Filed: Jun. 18, 2018

(65) Prior Publication Data

US 2019/0163049 A1 May 30, 2019

Related U.S. Application Data

(60) Provisional application No. 62/592,230, filed on Nov. 29, 2017.

(51) Int. Cl.
*G03F 1/70* (2012.01)
*G03F 1/36* (2012.01)

(52) U.S. Cl.
CPC . *G03F 1/70* (2013.01); *G03F 1/36* (2013.01)

(58) Field of Classification Search
CPC .................................... G03F 1/36; G03F 1/70
USPC ............................................................ 430/5
See application file for complete search history.

(56) References Cited

U.S. PATENT DOCUMENTS

| | | | |
|---|---|---|---|
| 8,796,666 | B1 | 8/2014 | Huang et al. |
| 8,850,366 | B2 | 9/2014 | Liu et al. |
| 8,906,595 | B2 | 12/2014 | Liu et al. |
| 8,954,899 | B2 | 2/2015 | Wu et al. |
| 9,093,530 | B2 | 4/2015 | Huang et al. |
| 9,367,655 | B2 | 6/2016 | Shih et al. |
| 9,390,217 | B2 | 7/2016 | Wang et al. |
| 9,548,303 | B2 | 1/2017 | Lee et al. |
| 9,865,542 | B2 | 1/2018 | Liaw et al. |
| 9,870,443 | B2 | 1/2018 | Huang et al. |

*Primary Examiner* — Christopher G Young
(74) *Attorney, Agent, or Firm* — Haynes and Boone, LLP

(57) ABSTRACT

A method performed by a computing system includes receiving a layout pattern, receiving a target pattern associated with the layout pattern, receiving a set of constraints related to the target pattern, simulating a first contour associated with the layout pattern, determining a first difference between the first contour and the target pattern, simulating a second contour associated with a modified layout pattern, and determining a second difference between the second contour and a modified target pattern. The modified target pattern is different than the target pattern and within the constraints. The method further includes fabricating a mask having the final layout pattern.

20 Claims, 16 Drawing Sheets

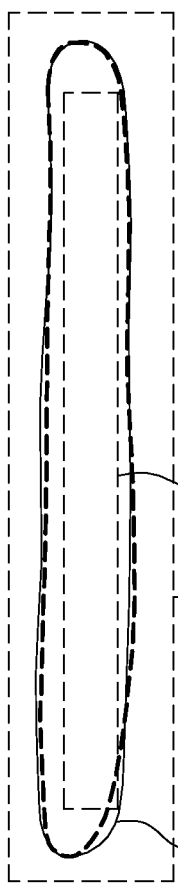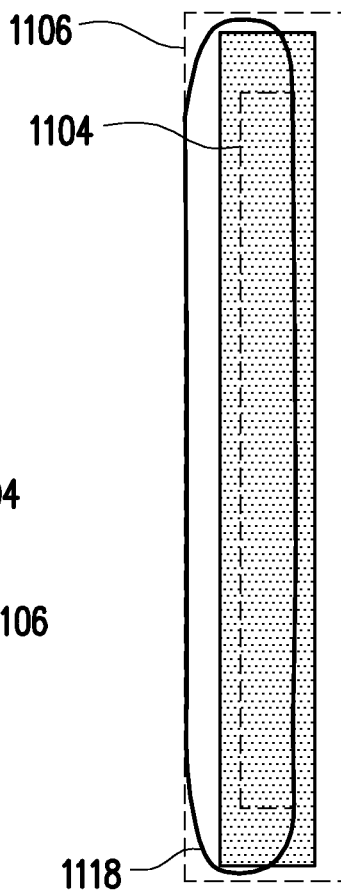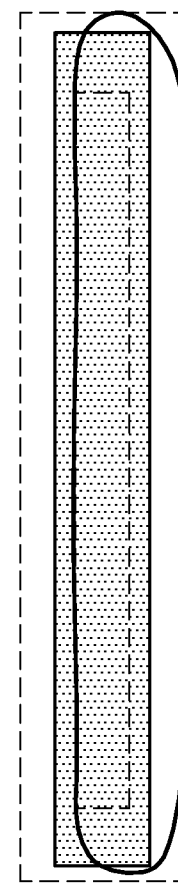
FIG. 11C FIG. 11D

MASK OPTIMIZATION PROCESS

PRIORITY INFORMATION

This application claims priority to U.S. Provisional Patent No. 62/592,230 filed Nov. 29, 2017 and entitled "Improved Mask Pattern Optimization," the disclosure of which is hereby incorporated by reference in the entirety.

BACKGROUND

Integrated circuits may be formed using various photolithographic techniques. Such techniques typically involve exposing a photoresist layer to a light source through a patterned photomask. In general, the final pattern formed onto the photoresist layer does not precisely match the pattern for which the pattern in the photo-mask was formed. This is caused by various photolithographic process parameters such as the resolution of the light source. It is important to ensure that the final printed pattern is not so far from the designed pattern that functionality of the circuit is adversely affected.

Typically, a circuit designer sends a target pattern to a mask manufacturer. The target pattern is typically defined as several polygonal features that form a desired pattern. The mask manufacturer may then create an initial layout pattern associated with the target pattern. Then, the mask manufacturer may apply various photolithographic models to the target pattern to create an optimized layout pattern. The optimized layout pattern may then be used to fabricate a mask. The fabricated mask is then used in photolithographic processes to form the desired pattern on a photoresist layer. It is desirable to improve this process to allow for better fabrication of more complex circuit designs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A, 11B, 11C, 11D, and 11E are diagrams showing various pattern features and simulated contours, according to one example of principles described herein.

DETAILED DESCRIPTION

Figure 1:
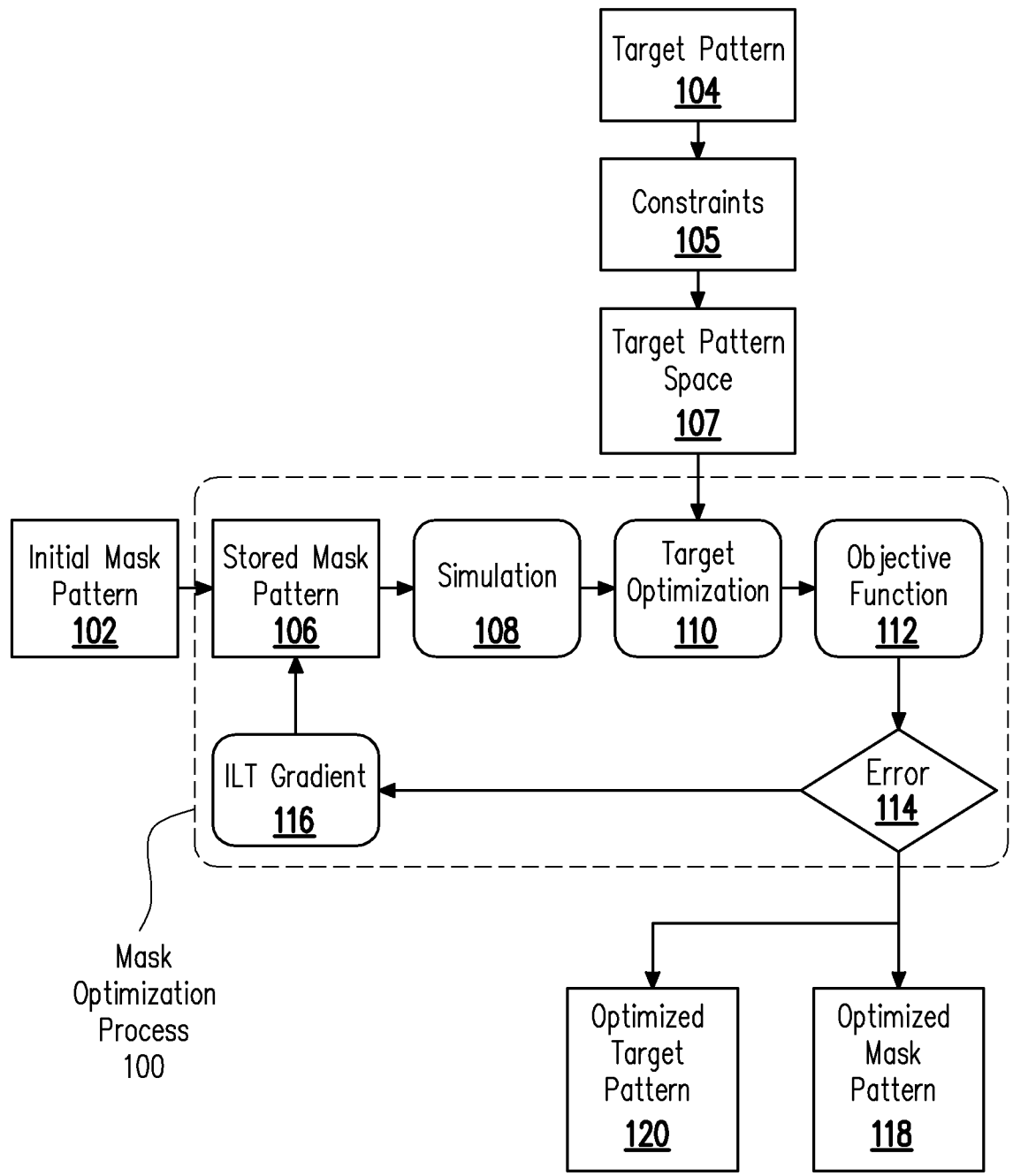
FIG. 1 is a flowchart showing an illustrative method for improved layout pattern optimization, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, a circuit designer typically sends a target pattern to a mask manufacturer. The target pattern is typically defined as several polygonal features that form a desired pattern. The mask manufacturer may then create an initial layout pattern associated with the target pattern. Then, the mask manufacturer may apply various photolithographic models to the target pattern to create an optimized layout pattern. These models take into account the parameters of the photolithographic system. Modern lithographic systems are based on projection optics—light is propagated through a mask and complex system of lenses which creates the desired pattern on a photoresist layer.

If the mask was fabricated with a pattern that exactly matched the target pattern, the actual pattern formed on the photoresist layer may be quite different than the target pattern. To avoid this, the photolithographic process is modeled so that the layout pattern can be optimized in order for the printed pattern to match the target pattern as closely as possible. This optimization process may be an iterative simulation process. Specifically, variations of the initial layout pattern are simulated until the simulated pattern matches the target pattern as closely as possible. It is desirable to improve this process.

According to principles described herein, a layout pattern for a mask is optimized so that its corresponding printed pattern will most closely match a target pattern. Additionally, the target pattern itself is allowed to vary within defined constraints. These constraints may be designed to allow for variation without substantially affecting performance of the circuit associated with the target pattern. For example, it may be the case that a mask can be modified to match the original target pattern with a 1 nanometer difference between the original target pattern and the simulated pattern. However, it may be that modification of the original target within the constraints can result in no difference between the simulated pattern and the modified target pattern.

FIG. 1 is a flowchart showing an illustrative method for improved layout pattern optimization. Specifically, FIG. 1 shows a mask optimization process 100 that receives a target pattern 104 and an initial layout pattern 102 as inputs and outputs an optimized layout pattern 118 and an optimized target pattern 120. The optimization process creates a stored layout pattern 106. The stored layout pattern then undergoes a simulation 108, a target optimization process 110, and an objective function evaluation 112. If, after such processes, the error 114 is less than a predetermined value, than the optimized layout pattern 118 and optimized target patter 120 are produced. If, however, the error 114 is greater than the predetermined value, the ILT gradient process 116 is applied and the stored layout pattern 106 is updated, and the simulation process continues. Typically, this iterative process repeats multiple times before an acceptable target pattern 120 and layout pattern 118 are produced.

The target pattern 104 is the pattern as it is intended to be formed on a wafer. For example, a circuit designer may design a circuit to be fabricated. Various functions may then be applied to that circuit design to create several layers of target patterns to be used to form that circuit. For example, one layer may be a gate layer. Another layer may be a via layer. Another layer may be a metal contact layer. Each layer is fabricated using a separate photolithographic process. For each photolithographic process and corresponding layer, there is a target pattern. The target pattern may appear as a layout of polygonal features.

Along with the target pattern 104, the mask optimization process 100 may receive a set of constraints 105. These constraints involve a set of rules that allow some variation in the target pattern while still maintaining the desired functionality of the circuit associated with the target pattern 104. All possible target patterns that the fit within the constraints 105 are defined by the target pattern space 107.

The initial layout pattern 102 is the layout of the pattern as it will be formed on the mask before any optimization is applied. In some examples, the initial layout pattern may simply match the target pattern. In some examples, however, the initial layout pattern may represent a modification of the target pattern. For example, a function may be applied to the target pattern that factors in the photolithographic process and creates an initial layout pattern 102 that will produce a close match to the target pattern 104 if fabricated and used in a photolithographic process.

The mask optimization process 100 involves stored layout pattern 106. The stored layout pattern 106 is a digital representation of the layout pattern. The stored layout pattern 106 may be updated as the iterative mask optimization process 100 proceeds.

For a particular iteration of the mask optimization process 100, a simulation process 108 is applied to the stored layout pattern 106. The simulation process 108 utilizes known parameters associated with the photolithographic process that are used to model the target pattern on a wafer. Specifically, the simulation process 108 simulates what the stored layout pattern 106 will look like if it is printed onto a wafer using specified parameters of the photolithographic process. The printed pattern may not match the layout pattern.

According to principles described herein, instead of trying various layout patterns to closely approximate a single target pattern, the target pattern itself is allowed to change within specified restrictions. For example, along with receiving the target pattern, the mask optimization process 100 may receive a set of rules associated with the target pattern. These rules may be designed to allow some variation in the target pattern while substantially maintaining the performance of the circuit as it was originally designed. Such rules may include, for example, line spacing restrictions, line width restrictions, and other spacing related rules. The process of allowing adjustments to the target pattern is denoted in the target optimization process 110.

After the target optimization process 110 is applied, an objective function evaluation process 112 is applied. The objective function evaluation process 112 produces an error value. As will be explained in further detail below, the error value represents the difference between a simulated contour and the target pattern 104. If this error value is below a predetermined threshold, or is determined to be a minimum error value, then the mask optimization process 100 is complete and outputs the optimized layout pattern 118 and the optimized target pattern 120. Other techniques may be used to terminate the process. For example, there may be a maximum number of iterations after which the most ideal options found so far are selected. If, however, the error value is above the predetermined threshold, or has not yet been determined that the error value is a minimum value, the mask optimization process 100 continues. The mask optimization process 100 continues by applying the ILT gradient function 116, which makes further adjustments to the stored layout pattern 106. The process is then repeated by simulating the modified stored layout pattern 106 and evaluating the objective function 112.

Using principles described herein, new target patterns can have relaxed pitch in local 1D regions and line-end pullback where appropriate. Compared to current methods, the optimized masks for such designs will be simpler, thereby decreasing mask writer time and improving mask reliability. Additionally, the process window will be improved, thereby improving wafer yield.

Using edge placement tolerance (as will be described in more detail below), this approach can improve current on-target ILT flows that use weight fields to de-emphasize wafer contour-target mismatch in non-critical areas such as around corners. That is, even without retargeting, this approach can improve the convergence properties of the optimization and provide a user with more direct control of the desired final wafer contours.

As described above, the mask optimization process 100 includes an objective function evaluation process 112. The objective function, without the target optimization process 110, may be defined as follows:

$$(m) = \int w(x)(\psi(x;m) - \psi_0(x))^2 dx,$$

where $\psi(x;m)$ is the simulated wafer contour with layout pattern m, $\psi_0(x)$ is the target pattern, and $w(x)$ is a weight field that assigns higher or lower values depending on the importance of the region. In general, the objective function can be a sum of such terms with simulated wafer contours at different process conditions to improve the overall process window. Other objective functions are contemplated as well.

With the target optimization process 110, the objective function may be further defined by the following:

$$\text{where } \psi_0(x) \approx \arg \min \|\psi(x;m) - \psi^*(x)\|, (\psi^*(x) \in \Omega)$$

Ω represents the target pattern space 107 of all possible target designs within the design target constraints 105. In other words, with the target optimization process 110, the objective function represents the difference between a simulated contour for a particular mask and the most similar target pattern within the target pattern space 107.

The process of finding the minimum objective function across multiple layout patterns and multiple target patterns is a bi-level optimization problem where the upper level problem is the standard ILT optimization and the lower level problem is the target design optimization.

Semiconductor circuits often include metal lines to connect various features (i.e., transistors) together. Vias are used to connect metal lines or other features of one layer to those of another layer. To avoid metal lines and other such features from becoming too thin for an adjoining via, additional constraints may be used. For example, additional minimum line width and spacing width constraints may be used. Combining well-chosen constraints 105, such as appropriate line width and spacing width constraints, it can be ensured that the resulting target pattern is lithographically friendly and has the same or similar electrical performance as the original design.

Figure 2A:
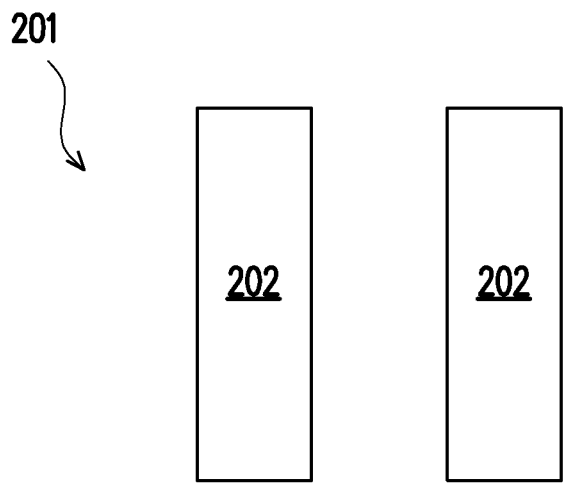
FIG. 2A is a diagram showing an illustrative target pattern, according to one example of principles described herein.

FIG. 2A is a diagram showing an illustrative target pattern 201. The target pattern 201 may correspond to the initial target pattern 104 described above. According to the present example, the target pattern 201 includes two features 202. In this example, the features 202 are two elongated, parallel lines. Such lines may be, for example metal lines. In some examples, such lines may represent fin structures or elongated gate devices.

Figure 2B:
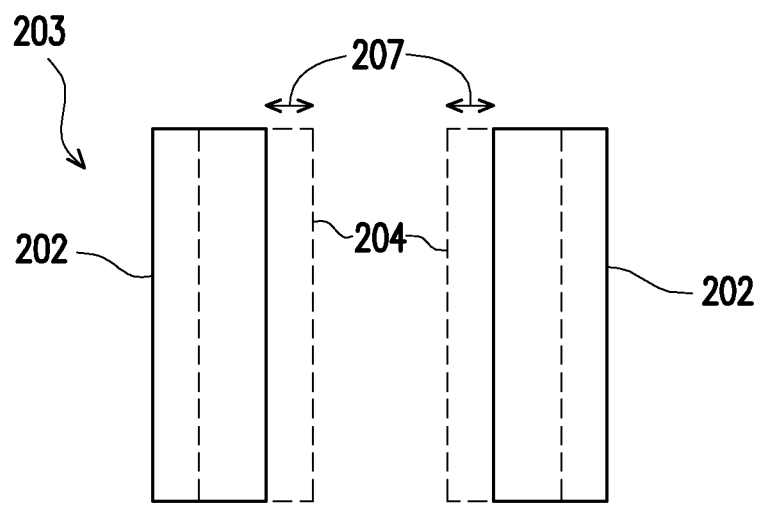
FIG. 2B is a diagram showing a modified target pattern, according to one example of principles described herein.

FIG. 2B is a diagram showing a modified target pattern 203. The modified target pattern 203 may correspond to the optimized target pattern 120 described above. According to the present example, the modified target pattern 203 includes features 202 which have been moved from original locations 204. Specifically, the features 202 have been moved from the original locations 204 by distance 207.

Figure 2C:
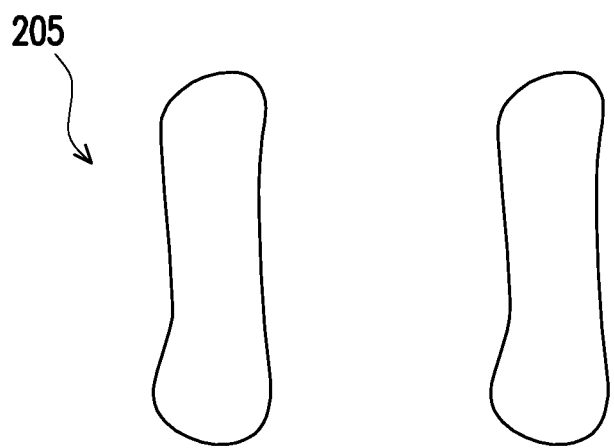
FIG. 2C is a diagram showing an illustrated modified layout pattern, according to one example of principles described herein.

FIG. 2C is a diagram showing an illustrated modified layout pattern 205. The modified layout pattern 205 may correspond to the optimized layout pattern 118 described above. According to the present example, the modified layout pattern 205 represents the layout pattern that will form the modified target pattern. The modified layout pattern 205 may be obtained through the mask optimization process 100 described above. Specifically, it may have been determined that the simulated contour from the modified layout pattern has the smallest difference between its corresponding target pattern compared with other mask designs and their corresponding target patterns in the target pattern space 107.

Figure 3A:
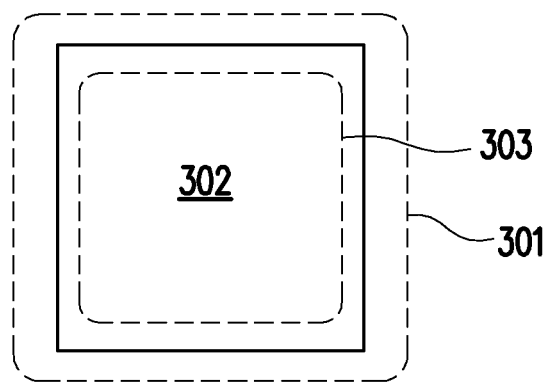
FIGS. 3A, 3B, and 3C are diagrams showing various edge placement error constraints for target pattern features, according to one example of principles described herein.
Figure 3B:
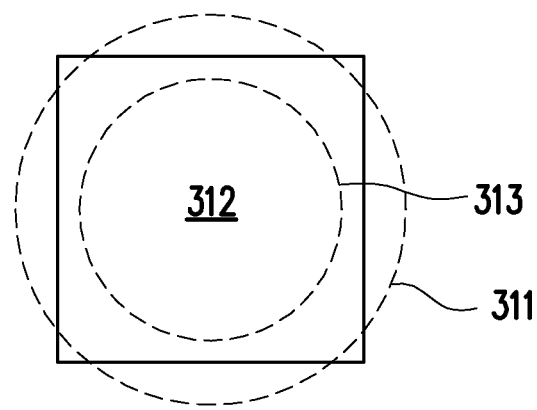
Figure 3C:
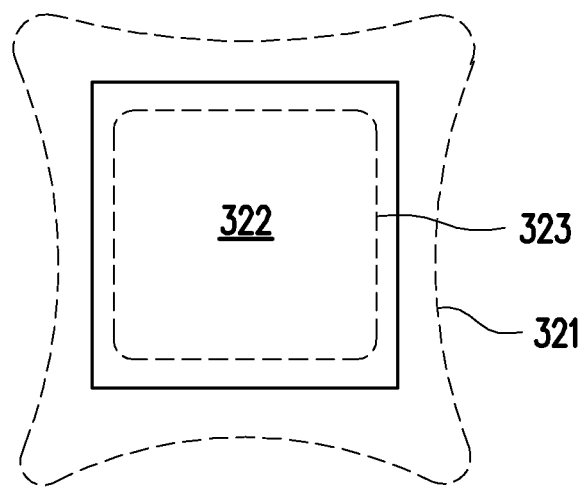

FIGS. 3A, 3B, and 3C are diagrams showing various edge placement error constraints for target pattern features. As described above, various constraints may be placed upon the layout pattern for the mask optimization process 100. One such constraint is referred to as an edge placement error constraint.

FIG. 3A illustrates edge placement error constraints for feature 302. Specifically, there is an outer constraint 301 and an inner constraint 303. The constraints 301, 303 define a region in which variations in the target pattern must remain. In other words, in a modified target pattern, the feature 302 may not be modified so that any part of it extends beyond the outer constraint 301 or within the inner constraint 303.

FIG. 3B illustrates edge placement error constraints for feature 312. Specifically, there is an outer constraint 311 and an inner constraint 313. The constraints 311, 313 define a region in which variations in the target pattern are to remain. In other words, in a modified target pattern, the feature 312 may not be modified so that any part of it extends beyond the outer constraint 311 or within the inner constraint 313.

FIG. 3C illustrates edge placement error constraints for feature 322. Specifically, there is an outer constraint 321 and an inner constraint 323. Inner constraint 323 is similar to the inner constraint 303. However, the outer constraint 321 is different than outer constraint 301. Specifically, the corners of outer constraint 321 are extended. The constraints 321, 323 define a region in which variations in the target pattern are to remain. In other words, in a modified target pattern, the feature 322 may not be modified so that any part of it extends beyond the outer constraint 321 or within the inner constraint 323.

Figure 4A:
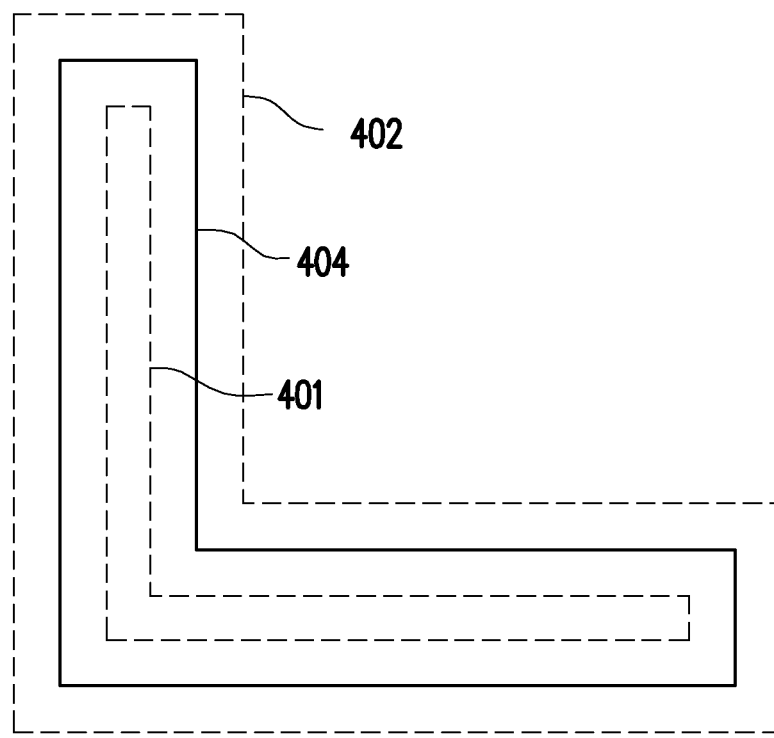
FIG. 4A is a diagram showing an edge placement error for a target pattern feature, according to one example of principles described herein.
Figure 4B:
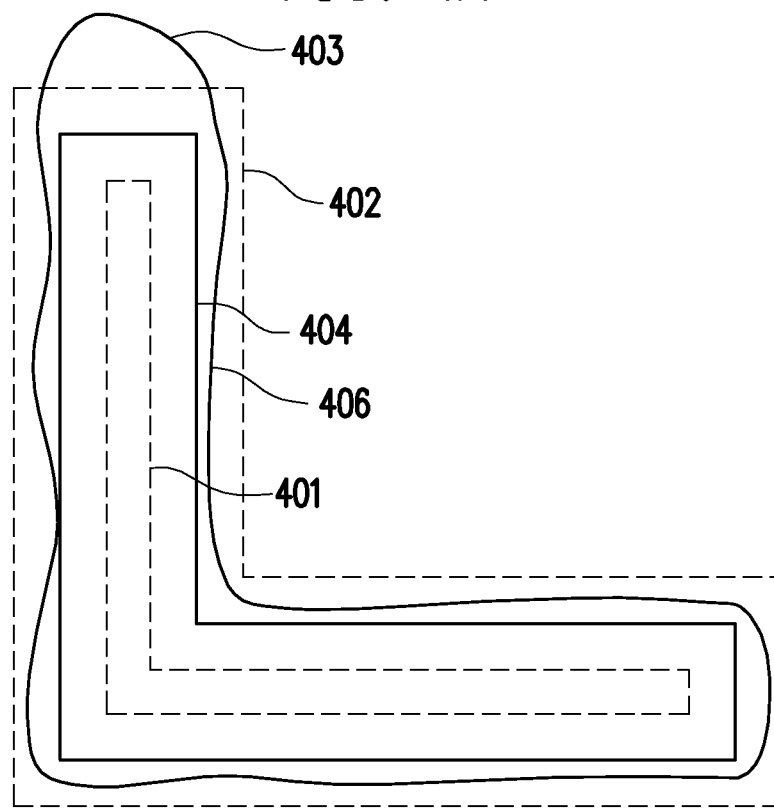
FIG. 4B is a diagram showing edge placement errors for a target pattern feature and a simulated contour, according to one example of principles described herein.

FIG. 4A is a diagram showing an edge placement error constraints for a target pattern feature 404. According to the present example, there is an outer constraint 402 and an inner constraint 401. FIG. 4B is a diagram showing edge placement error constraints for a target pattern feature and a simulated contour 406. Specifically, a simulated contour 406 is shown that is mostly within the outer constraint 402. However, a portion 403 extends beyond the outer constraint 402. Thus, contour 406 is in violation of the constraint.

Figure 4C:
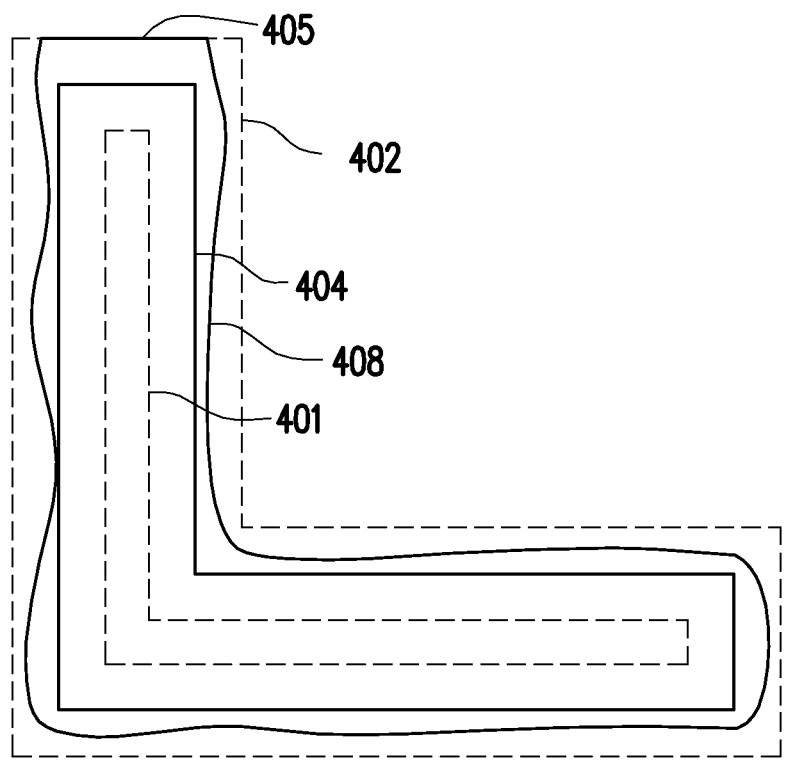
FIG. 4C is a diagram showing edge placement errors for a target pattern feature and a constrained simulated contour, according to one example of principles described herein.
Figure 4D:
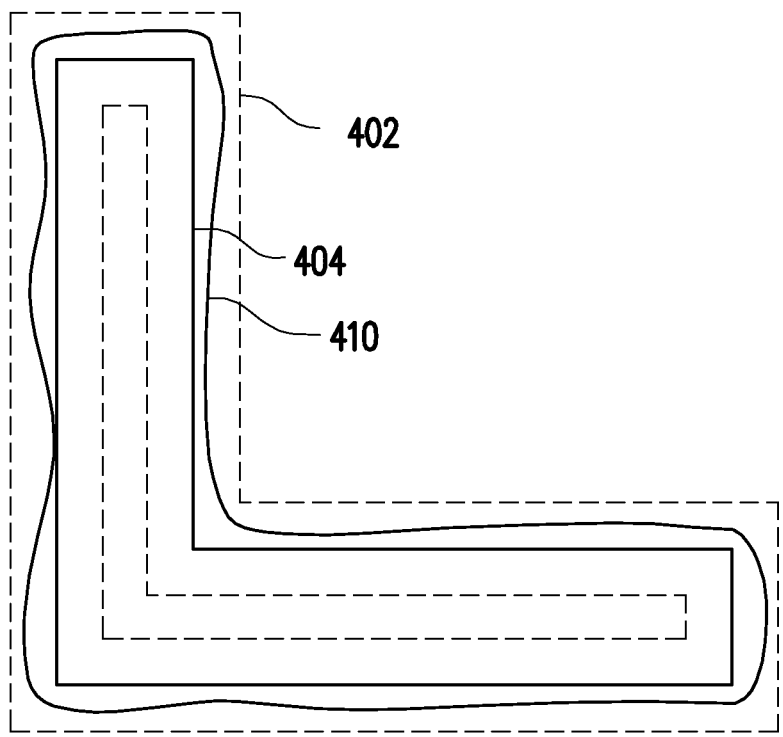
FIG. 4D is a diagram showing edge placement errors for a target pattern feature and a compliant simulated contour, according to one example of principles described herein.

FIG. 4C is a diagram showing edge placement error constraints for a target pattern feature and a constrained simulated contour. Specifically, in order to comply with the constraint 402 the contour is cut off at portion 405. Thus, the constrained contour 408 fits within the outer constraint 402. The constrained contour 408 may be used with the objective function to help construct the new target. Specifically, after iteratively applying the mask optimization process 100 described above, a contour 410 as shown in FIG. 4D can be derived. Specifically, the ILT gradient process 116 may be applied to the constrained contour 408. Contour 408 is an example of the output of Target Optimization 110. This is fed into the Objective Function 112 before the gradient process 116 is applied. The result of that process may then be used to update the stored layout pattern 106. After a number of iterations, the compliant contour 410 is produced. FIG. 4D is a diagram showing edge placement error constraints for a target pattern feature and a compliant contour 410. The compliant contour 410 does not extend beyond the outer constraint 402 and thus does not need to be "cut off" as shown in FIG. 4C. FIG. 4D represents the acceptable result after applying principles described herein.

Figure 5A:
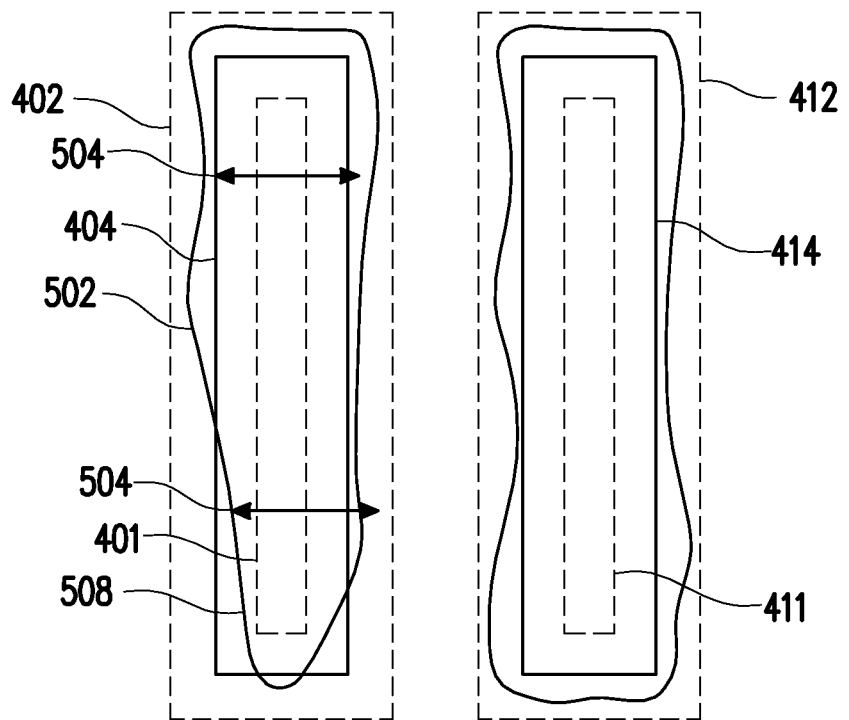
FIG. 5A is a diagram showing illustrative line width constraints, according to one example of principles described herein.

FIG. 5A is a diagram showing illustrative line width constraints. According to the present example, feature 404 has an outer constraint 402 and an inner constraint 401. Similarly, feature 414 has in outer constraint 412 and an inner constraint 411. The contour associated with feature 404 remains within the inner and outer constraints 401, 402. However, the contour 502 is in violation of a line width constraint 504. In some examples, violations near line-ends can be specially handled and may or may not be ignored depending on user preference. Specifically, the bottom end 508 of contour 502 tapers and is thus smaller than the desired line width. Thus, the contour 502 should be modified so that it does not violate the line width constraint.

Figure 5B:
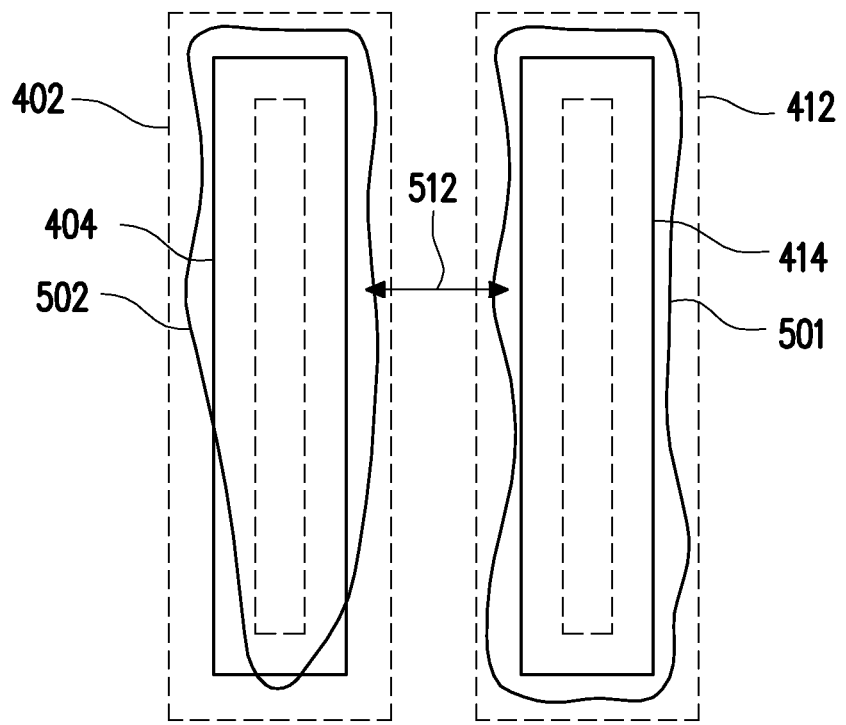
FIG. 5B is a diagram showing illustrative line spacing constraints, according to one example of principles described herein.

FIG. 5B is a diagram showing illustrative line spacing constraints. As described above, the contour 502 associated with feature 404 remains within the inner and outer constraints 401, 402. Similarly, the contour 501 associated with feature 414 remains within the inner and outer constraints 411, 412. However, the contours 501, 502 are in violation of a line spacing constraint 512. Accordingly, the contours should be modified to comply with such a constraint 512.

Figure 6:
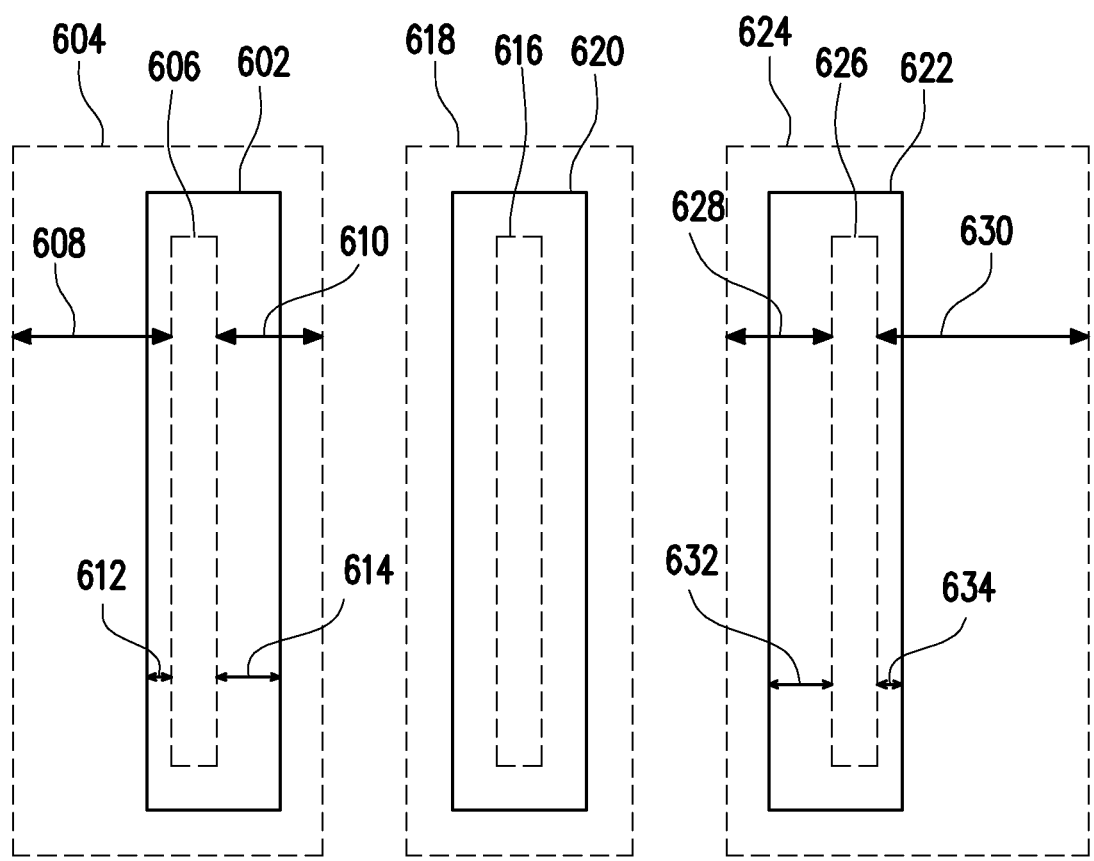
FIG. 6 is a diagram showing illustrative asymmetric edge placement error constraints, according to one example of principles described herein.

FIG. 6 is a diagram showing illustrative asymmetric edge placement error constraints. While the edge placement error constraints associated with previous figures describe symmetric constraints, asymmetric edge placement error constraints are contemplated as well. FIG. 6 illustrates a first feature 602, a second feature 620, and a third feature 622. The first feature 602 has an inner constraint 606 and an outer constraint 604. The distance 608 between the inner constraint 606 and the outer constraint 604 is larger than the distance 610 between the inner constraint 606 and the outer constraint 604 on the other side of the feature 602. Additionally, the distance 612 between the inner constraint 606 and the feature 602 is smaller than the distance 614 between the inner constraint 606 and the edge of the feature 602.

In the present example, the distance 628 between the inner constraint 626 and the outer constraint 624 is smaller than the distance 630 between the inner constraint 626 and the outer constraint 624 on the other side of the feature 622. Additionally, the distance 632 between the inner constraint 626 and the edge of the feature 622 is greater than the distance 634 between the inner constraint 626 and the edge of the feature 622 on the other side of the feature 622.

This principles described herein can be used for model-based retargeting but also have advantages for the standard fixed target approach. Generally, the weight field w(x) of the objective function as described above is used to de-emphasize less important regions of the target, such as on corners or jogs. This is because such features are neither lithographically feasible nor desired. However, if the fixed target approach is replaced with edge placement tolerance that is wider around such features, the target optimization approach directly addresses what the weight field approximates. Because these edge placement tolerances may already be constructed as part of downstream lithography verification, they can be re-used in the mask design optimization. The weight field may be used in conjunction with principles described herein.

Figure 7:
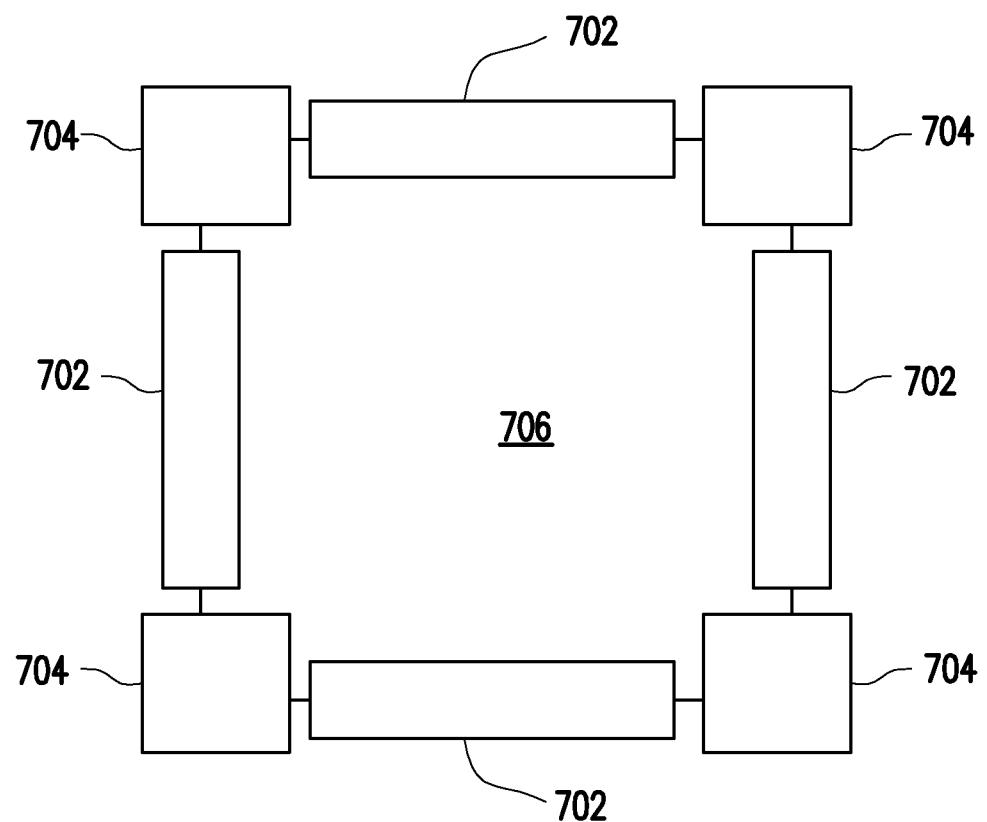
FIG. 7 is a diagram showing different weight fields, according to one example of principles described herein.

FIG. 7 is a diagram showing different weight fields. In some examples, differences between a simulated contour and a corresponding target pattern at various regions may be weighted differently. This may be defined by the w(x) portion of the objective function as described above. For example, the differences between the simulated contour and target pattern may be less weighted at corners of a particular feature 706 than at other portions of the feature 706. Specifically, FIG. 7 illustrates a feature 706 with low weight fields 704 at the corners and high weight fields 702 along the edges between the corners.

Figure 8:
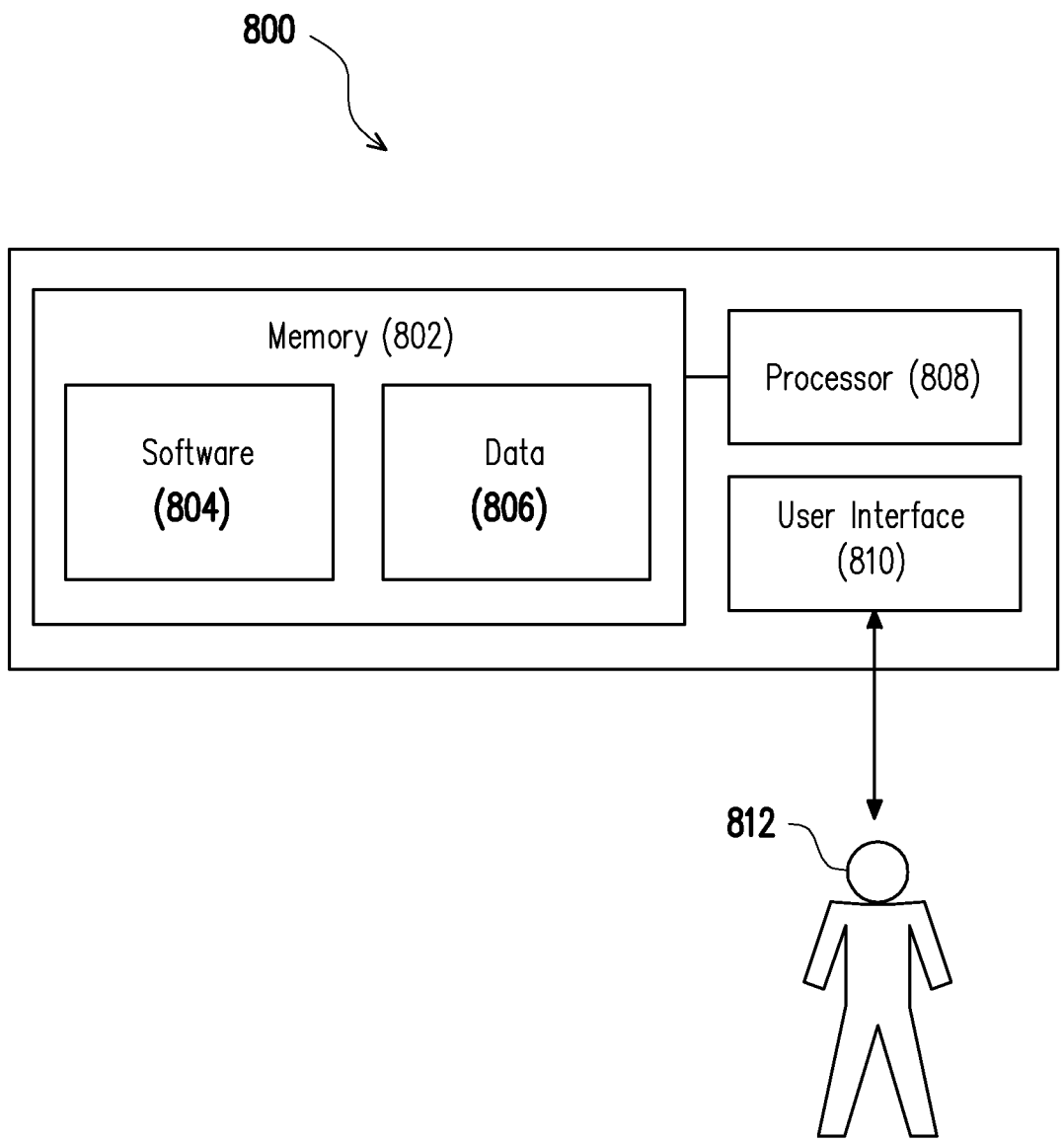
FIG. 8 is a diagram showing an illustrative computing system for performing target pattern adjustment and modification as described herein.

FIG. 8 is a diagram showing an illustrative computing system for performing target pattern adjustment and modification as described herein. According to certain illustrative examples, the physical computing system 800 includes a memory 802 having software 804 and data 806 stored thereon. The physical computing system 800 also includes a processor 808 and a user interface 810.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 804 and data 806. The data 806 may include digital representations of the target pattern 104, initial layout pattern 102, optimized target pattern 120, and optimized layout pattern 118. The software 806 may include machine readable instructions for performing the processes described herein, such as the mask optimization process 100. For example, the software 806 may include non-transitory machine readable instructions for receiving a layout pattern, receiving a target pattern associated with the layout pattern, receiving a set of constraints related to the target pattern, simulating a first contour associated with the layout pattern, determining a first difference between the first contour and the target pattern, simulating a second contour associated with a modified layout pattern, and determining a second difference between the second contour and a modified target pattern. The modified target pattern being different than the target pattern and within the constraints.

The software 806 may also include non-transitory machine readable instructions for receiving a layout pattern, receiving a target pattern associated with the layout pattern, receiving a set of constraints related to the target pattern, iteratively simulating contours of layout pattern variations across a target pattern space, the target pattern space comprising a variation of the target pattern within the constraints, and selecting a final layout pattern and a final target pattern from the target pattern space.

The physical computing system 800 also includes a processor 808 for executing the software 804 and using or updating the data 806 stored in memory 802. In addition to storing the software 804, the memory 802 may store an operating system. An operating system allows other applications to interact properly with the hardware of the physical computing system.

A user interface 810 may provide a means for a user 812 to interact with the system. The user 812 may use various tools such as a keyboard or a mouse to input information into the physical computing system. Additionally, various output devices such as a monitor may be used to provide information to the user 812. The user may input various data such as constraints associated with a target pattern in order to create the target pattern space 107.

Figure 9:
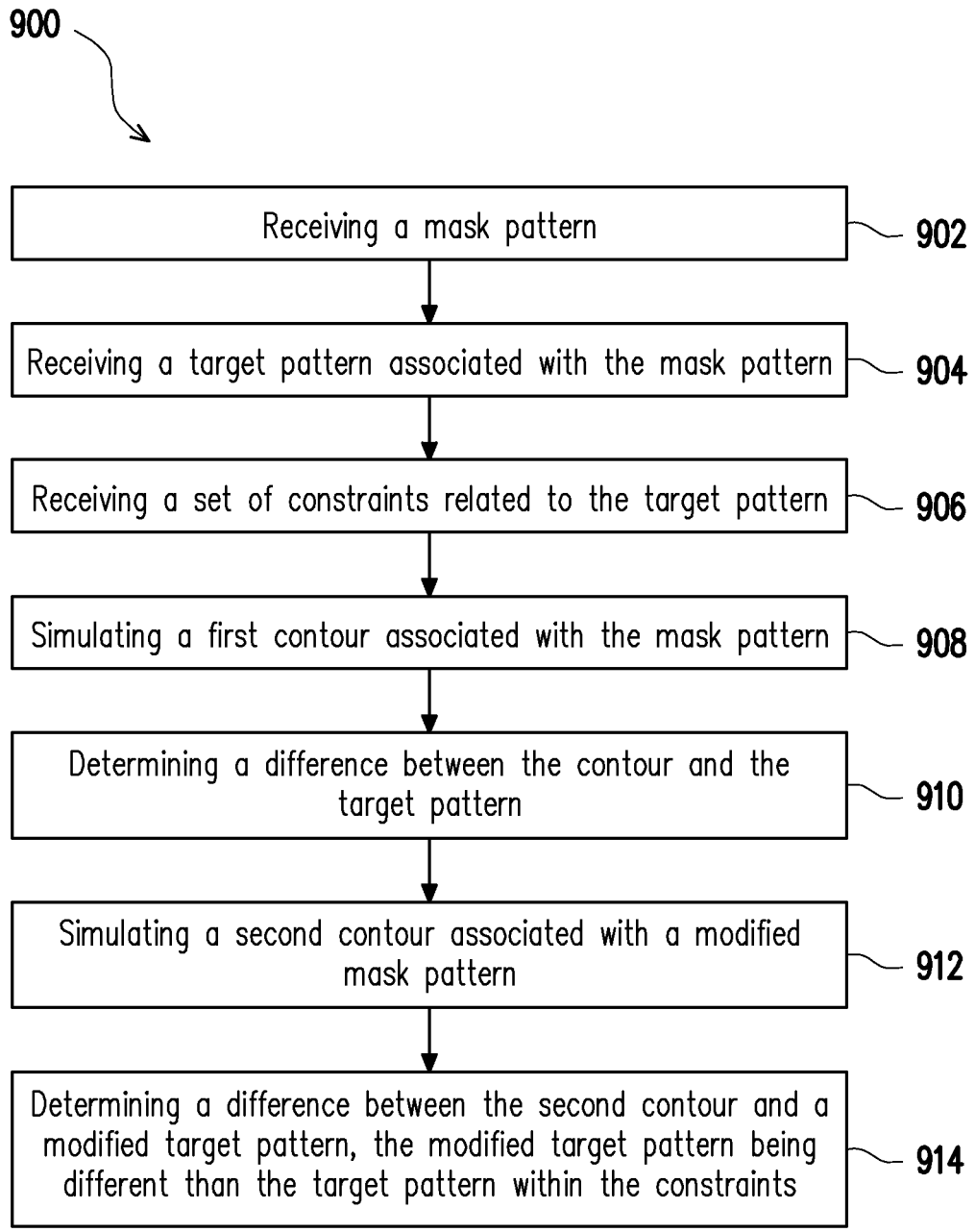
FIG. 9 is a flowchart showing an illustrative method for improved layout pattern optimization, according to one example of principles described herein.

FIG. 9 is a flowchart showing an illustrative method for improved layout pattern optimization. The method may be performed by machine readable instructions that are executed by a physical processing system. According to the present example, the method 900 includes a process 902 for receiving a layout pattern. The layout pattern may be an initial layout pattern such as initial layout pattern 102.

The method 900 further includes a process 904 for receiving a target pattern associated with the layout pattern. The target pattern may be, for example, target pattern 104 as described above. The method 900 further includes a process 906 for receiving a set of constraints related to the target pattern. The constraints may be, for example, constraints 105. Such constraints may include edge placement error constraints, line width constraints, and line spacing constraints. The edge placement error constraints may be within a range of about 0.5 nanometers and 1.0 nanometers from the original target pattern. In some examples, the edge placement error constraints may be asymmetrical.

The method 900 further includes a process 908 for simulating a first contour associated with the layout pattern. This may be, for example, the simulation process 108 during a first iteration of the mask optimization process 100. Simulating the first contour may involve other aspects of the mask optimization process 100. For example, simulating the first contour may also include the target optimization process 110.

The method 900 further includes a process 910 for determining a difference between the first contour and the target pattern. In some examples, determining the difference includes the objective function evaluation process 112 and the error value determination process 114.

The method 900 further includes a process 912 for simulating a second contour associated with a modified layout pattern. This may be, for example, the simulation process 108 during a subsequent iteration of the mask optimization process 100. Simulating the second contour may involve other aspects of the mask optimization process 100. For example, simulating the second contour may also include the target optimization process 110. The modified layout pattern may be a pattern that has been updated after previous iterations of the mask optimization process.

The method 900 further includes a process 914 for determining a difference between the second contour and a modified target pattern, the modified target pattern being different than the target pattern and within the constraints. In other words, the modified target pattern is different than the original target pattern yet is still within the target pattern space.

Processes 912 and 914 may iteratively continue. For example, multiple contours may be simulated for various modified layout patterns and various target patterns within the target pattern space. Then, a final target pattern from the target pattern space may be selected, as well as the associated layout pattern to create that final target pattern. The selected target pattern and layout pattern may have the smallest difference between a simulated contour for the final layout pattern and the final target pattern.

After selecting the final layout pattern and target pattern, the final layout pattern may be fabricated. With the fabricated mask, the final target pattern may be created on a wafer using photolithographic processes. In some examples, the digital representation of the final target pattern may be made to be rectangular instead of curved for purposes of inspection or verification. This process is sometimes referred to as manhattanizing or rectangularizing.

Figure 10:
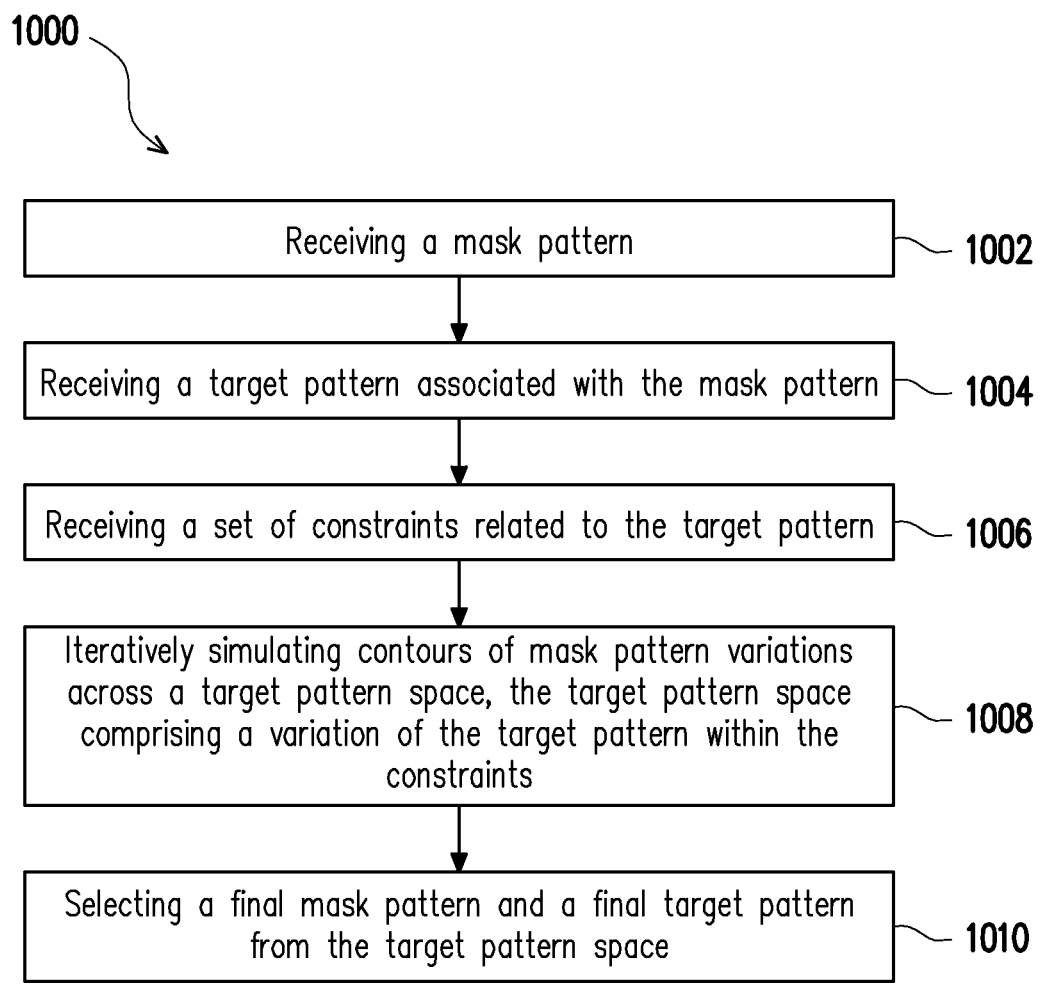
FIG. 10 is a flowchart showing an illustrative method for improved layout pattern optimization, according to one example of principles described herein.

FIG. 10 is a flowchart showing an illustrative method for improved layout pattern optimization. The method may be performed by machine readable instructions that are executed by a physical processing system. According to the present example, the method 1000 includes a process 1002 for receiving a layout pattern. The layout pattern may be an initial layout pattern such as initial layout pattern 102.

The method 1000 further includes a process 1004 for receiving a target pattern associated with the layout pattern. The target pattern 104 may be, for example, target pattern 104 as described above. The method 1000 further includes a process 1006 for receiving a set of constraints related to the target pattern. The constraints may be, for example, constraints 105. Such constraints may include edge placement error constraints, line width constraints, and line spacing constraints. The edge placement error constraints may be within a range of about 0.5 nanometers and 1.0 nanometers from the original target pattern. In some examples, the edge placement error constraints may be asymmetrical.

The method 1000 further includes a process 1008 for iteratively simulating contours of layout pattern variations across a target pattern space. The target pattern space may include variations of the target pattern within the constraints. This iterative process may include the simulation process 108, the target optimization process 110, the objective function evaluation process 112, the error value determination process 114 and the ILT gradient process described above. Simulation may occur for a variety of mask contours across several variations of the target pattern within the constraints.

The method 1000 further includes process 1010 for selecting a final layout pattern and a final target pattern from the target pattern space. A simulated contour of the final layout pattern has a minimal difference from the final target pattern across the target pattern space. After the final layout pattern is determined, a mask with that final layout pattern may be fabricated.

With the fabricated mask, the final target pattern may be created on a wafer using photolithographic processes. In some examples, the digital representation of the final target pattern may be made to be rectangular instead of curved. This process is sometimes referred to as manhattanizing or rectangularizing.

The principles described herein may be used for a variety of photolithographic technologies to form a variety of features. For example, the principles described herein may be used in accordance with Deep Ultraviolet (DUV) lithography and Extreme Ultraviolet (EUV) lithography. Additionally, the principles described herein may be used to form various features including, but not limited to, fin structures, polysilicon gate structures, vias, metal interconnects, and other features.

Figure 11A:
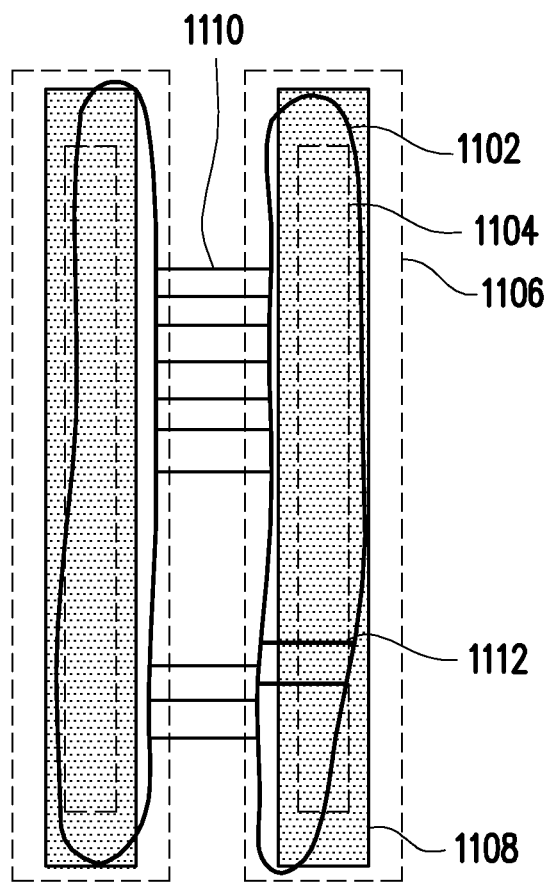

FIGS. 11A, 11B, 11C, 11D, and 11E are diagrams showing various pattern features and simulated contours associated with the retargeting process described herein. FIG. 11A illustrates initial design target features 1108. An inner edge placement error constraint 1104 and an outer edge placement error constraint 1106 are defined. A simulated contour 1102 is also shown. This contour 1102 may be derived using, for example, process 108 as described above. As can be seen the simulated contour 1102 is in violation of the edge placement error constraint because a portion of the contour 1102 is within the inner edge placement error constraint. The simulated contour 1102 also has a number of line spacing violations 1110 and line width spacing violations 1112.

Figure 11B:
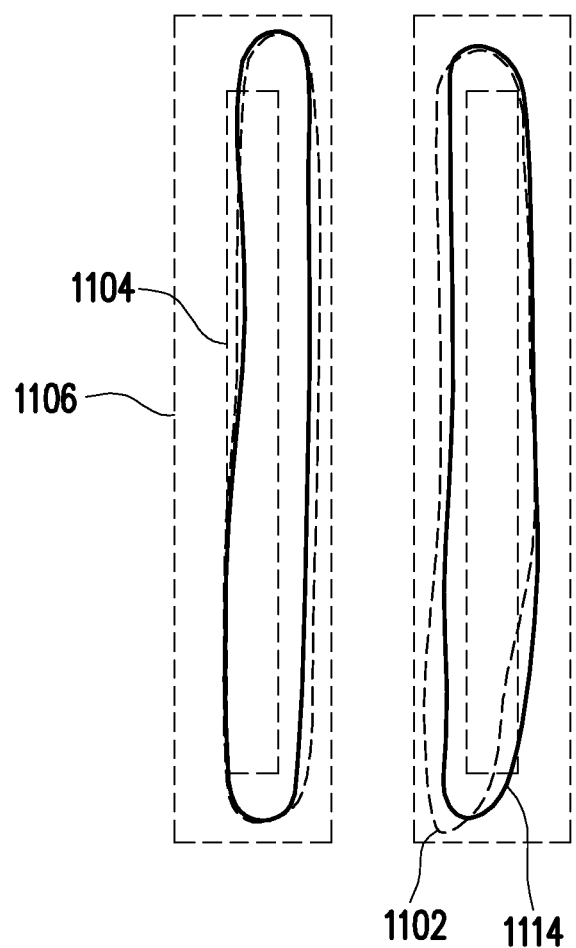

FIG. 11B illustrates an updated contour 1114 that complies with the line width and line spacing constraints, but not necessarily the edge placement error constraints 1104, 1106. FIG. 11C illustrates an updated contour 1116 that complies with the edge placement error constraints 1104, 1106, as well as the both the line spacing and line width constraints. In some examples, smoothing constraints can be applied as well on top of the results of the updated contour 1116.

Figure 11E:
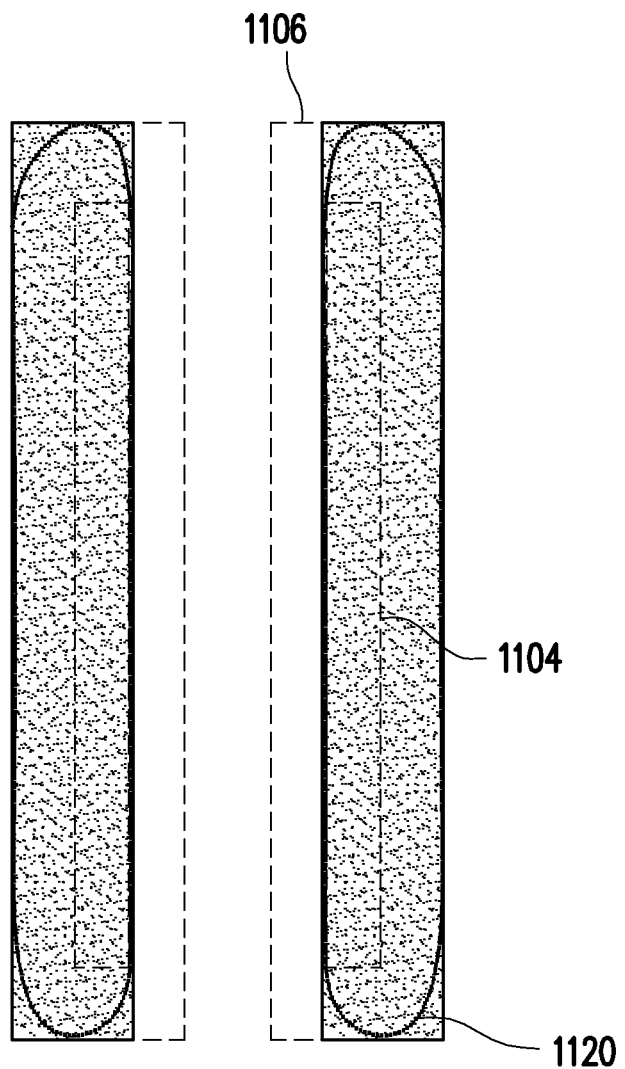

FIG. 11D illustrates an optimized target pattern 1118 that may be derived according to the target optimization process 110 described above. In other words, the optimized target pattern 1118 is a variation of the original target pattern that when simulated results in a contour that is closer to that of the optimized target pattern. FIG. 11E illustrates a manhattanized version 1120 of the optimized target pattern.

Figure 12A:
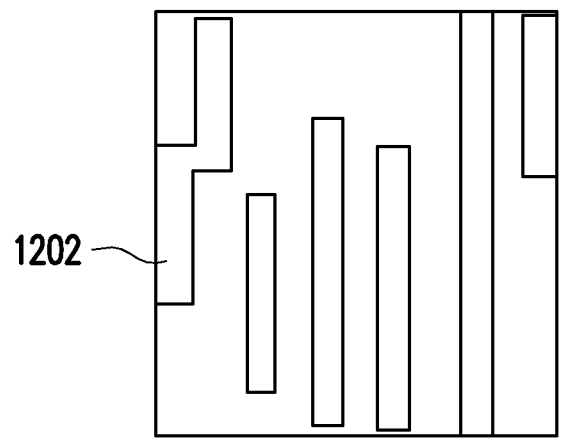
FIGS. 12A, 12B, and 12C are diagrams showing an illustrative retargeting process, according to one example of principles described herein.
Figure 12B:
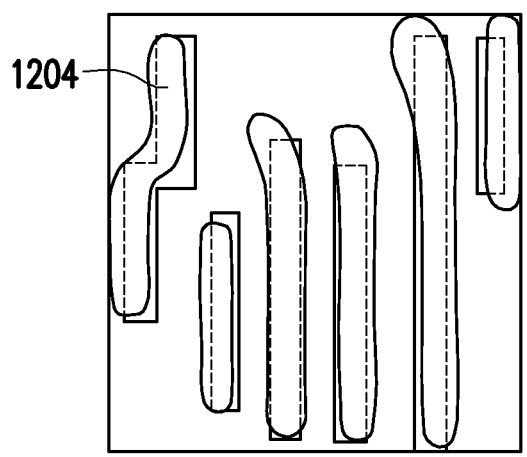
Figure 12C:
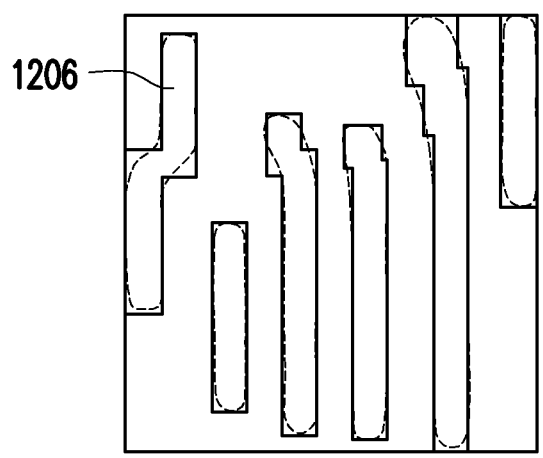

FIGS. 12A, 12B, and 12C are diagrams showing an illustrative retargeting process. In the present example, FIG. 12A illustrates an original target pattern 1202. The original target pattern 1202 may correspond to target pattern 104. FIG. 12B illustrates an optimized target pattern 1204. The optimized target pattern 1204 may correspond to optimized target pattern 120. FIG. 12C illustrates a manhattanized version 1206 of the optimized target pattern 1204.

Figure 13:
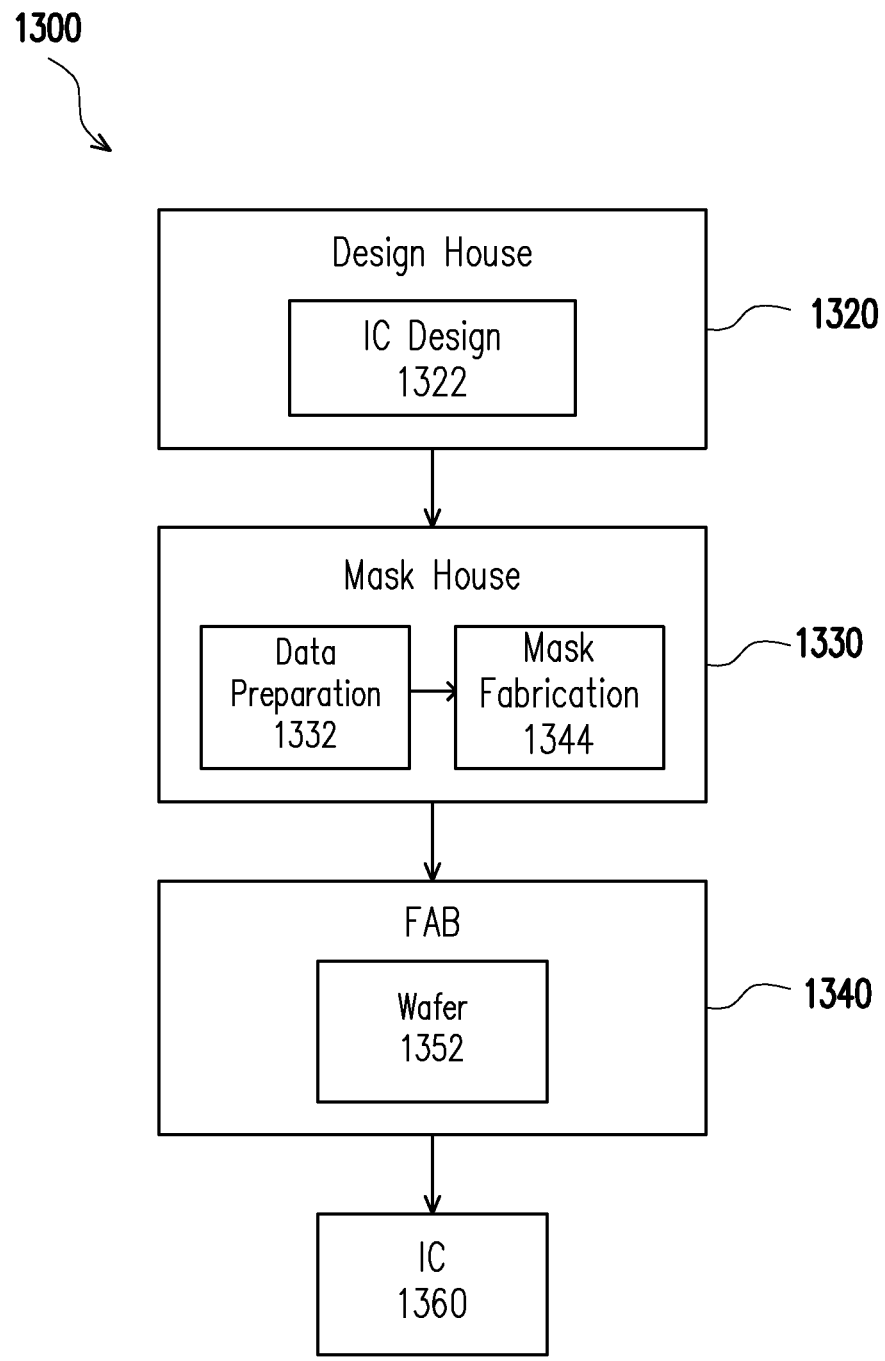
FIG. 13 is a simplified block diagram of an embodiment of an integrated circuit (IC) manufacturing system and an associated IC manufacturing flow, according to one example of principles described herein.

FIG. 13 is a simplified block diagram of an embodiment of an integrated circuit (IC) manufacturing system 1300 and an IC manufacturing flow associated therewith, which may be used to fabricate the masks using the processes described above. The IC manufacturing system 1300 includes a plurality of entities, such as a design house 1320, a mask house 1330, and an IC manufacturer 1350 (i.e., a fab), that interact with one another in the design, development, and manufacturing cycles and/or services related to manufacturing an integrated circuit (IC) device 1360. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 1320, mask house 1330, and IC manufacturer 1350 may be owned by a single larger company, and may even coexist in a common facility and use common resources.

The design house (or design team) 1320 generates an IC design layout 1322. The IC design layout 1322 includes various geometrical patterns designed for an IC device 1360. The geometrical patterns correspond to patterns of metal, oxide, or semiconductor layers that make up the various components of the IC device 1360 to be fabricated. The various layers combine to form various IC features. For example, a portion of the IC design layout 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 1320 implements a proper design procedure to form the IC design layout 1322. The design procedure may include logic design, physical design, and/or place and route. The IC design layout 1322 is presented in one or more data files having information of the geometrical patterns. For example, the IC design layout 1322 can be expressed in a GDSII file format or DFII file format.

The mask house 1330 uses the IC design layout 1322 to manufacture one or more masks to be used for fabricating the various layers of the IC device 1360 according to the IC design layout 1322. The mask house 1330 performs mask data preparation 1332, where the IC design layout 1322 is translated into a form that can be physically written by a mask writer, and mask fabrication 1344, where the design layout prepared by the mask data preparation 1332 is modified to comply with a particular mask writer and/or mask manufacturer and is then fabricated. In the present embodiment, the mask data preparation 1332 and mask fabrication 1344 are illustrated as separate elements, however, the mask data preparation 1332 and mask fabrication 1344 can be collectively referred to as mask data preparation.

The mask data preparation 1332 typically includes optical proximity correction (OPC) which uses lithography enhancement techniques to compensate for image errors, such as those that can arise from diffraction, interference, or other process effects. For example, OPC may adjust line widths depending on the density of surrounding geometries; add "dog-bone" endcaps to the end of lines to prevent line end shortening; or correct for electron beam (e-beam) proximity effects. OPC may add assist features, such as scattering bars, serif, and/or hammerheads to the IC design layout 1322 according to optical models or rules such that, after a lithography process, a final pattern on a wafer is improved with enhanced resolution and precision. The mask data preparation 1332 can include further resolution enhancement techniques (RET), such as off-axis illumination, sub-resolution assist features, phase-shifting masks, other suitable techniques, or combinations thereof. One technique that may be used in conjunction with OPC is inverse lithography technology (ILT), which treats OPC as an inverse imaging problem. In some cases, ILT produces unintuitive mask patterns, such as freeform (or arbitrary-shaped) patterns.

The mask data preparation 1332 further includes a mask rule checker (MRC) that checks the IC design layout that has undergone processes in OPC with a set of mask creation rules which may contain certain geometric and connectivity restrictions to ensure sufficient margins, to account for variability in semiconductor manufacturing processes, etc. In some cases, MRC modifies the IC design layout to compensate for limitations during mask fabrication 1344, which may undo part of the modifications performed by OPC in order to meet mask creation rules. For example, MRC may perform Manhattan conversion to convert a curvy ideal mask from ILT to a zigzag polygon pattern in order to conform to mask creation rules. In one example, Manhattan conversion restricts the output pattern edges to be either horizontal or vertical to accommodate an e-beam mask writer. Consequently, it may produce extensive segments and jogs that suffer from long run time in Mask Fabrication 1344. The mask data preparation 1332 may further include lithography process checking (LPC) that simulates processing that will be implemented by the IC manufacturer 1350 to fabricate the IC device 1360. LPC simulates this processing based on the IC design layout 1322 to create a simulated manufactured device, such as the IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or combinations thereof.

After a simulated manufactured device has been created by LPC, if the simulated device is not close enough in shape to satisfy design rules, certain steps in the mask data preparation 1332, such as OPC and MRC, may be repeated to refine the IC design layout 1322 further.

It should be understood that the above description of the mask data preparation 1332 has been simplified for the purposes of clarity, and data preparation may include additional features such as a logic operation (LOP) to modify the IC design layout according to manufacturing rules. Additionally, the processes applied to the IC design layout 1322 during data preparation 1332 may be executed in a variety of different orders.

After mask data preparation 1332 and during mask fabrication 1344, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In an embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM.

The IC manufacturer 1350, such as a semiconductor foundry, uses the mask (or masks) fabricated by the mask house 1330 to fabricate the IC device 1360. The IC manufacturer 1350 is a IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 1360. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

Using principles described herein, new target patterns can have relaxed pitch in local 1D regions and line-end pullback where appropriate. Compared to conventional methods, the optimized masks for such designs will be simpler, thereby decreasing mask writer time and improving mask reliability. Additionally, the process window will be improved, thereby improving wafer yield.

In a first example, a method performed by a computing system includes receiving a layout pattern, receiving a target pattern associated with the layout pattern, receiving a set of constraints related to the target pattern, simulating a first contour associated with the layout pattern, determining a first difference between the first contour and the target pattern, simulating a second contour associated with a modified layout pattern, and determining a second difference between the second contour and a modified target pattern. The modified target pattern is different than the target pattern and within the constraints. The method further includes fabricating a mask having the final layout pattern.

The first example may further include simulating multiple contours using multiple modified layout patterns and multiple modified target patterns within the constraints.

The first example may further include selecting a final target pattern of the multiple modified target patterns and a final layout pattern within the multiple of modified layout patterns having a smallest difference between a simulated contour for the final layout pattern and the final target pattern.

The first example may further include using the mask to fabricate an integrated circuit.

The first example may further include rectangularizing the final target pattern.

In the first example, the constraints may include edge placement error constraints.

In the first example, the edge placement error constraints may be within a range of about 0.5 nanometers and 1.0 nanometers.

In the first example, the edge placement error constraints may be asymmetrical.

In the first example, the constraints may include line width constraints.

In the first example, the constraints may include line spacing constraints.

In a second example, a method performed by a computing system includes receiving a layout pattern, receiving a target pattern associated with the layout pattern, receiving a set of constraints related to the target pattern, and iteratively simulating contours of layout pattern variations across a target pattern space. The target pattern space includes variations of the target pattern within the constraints. The method further includes selecting a final layout pattern and a final target pattern from the target pattern space and fabricating a mask having the final layout pattern.

In the second example, a simulated contour of the final layout pattern may have a minimal difference from the final target pattern across the target pattern space.

The second example may further include using the mask to fabricate an integrated circuit.

In the second example, the constraints may include edge placement error constraints.

In the second example, the constraints may include line width constraints and line spacing constraints.

The second example may further include rectangularizing the final target pattern.

The second example may further include weighting differences between a simulated contour and a corresponding target pattern at various regions differently.

In a third example, a system includes a processor and a memory comprising machine readable instructions that when executed by the processor cause the system to: receive a layout pattern and a target pattern associated with the layout pattern, and receive a set of constraints related to the target pattern. The constraints place limits on target pattern variation. The system is further to iteratively simulate contours of layout pattern variations across a target pattern space within the constraints and select a final layout pattern and a final target pattern from the target pattern space. A simulated contour of the final layout pattern has a minimal difference from the final target pattern across the target pattern space.

In the third example, the constraints may include at least one of: edge placement error constraints, line width constraints, and line spacing constraints.

In the third example, the edge placement constraints may be asymmetrical.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method performed by a computing system, the method comprising:
   receiving a layout pattern;
   receiving a target pattern associated with the layout pattern;
   receiving a set of constraints related to the target pattern;
   simulating a first contour associated with the layout pattern;
   determining a first difference between the first contour and the target pattern;
   simulating a second contour associated with a modified layout pattern;
   determining a second difference between the second contour and a modified target pattern, the modified target pattern being different than the target pattern and within the constraints; and
   fabricating a mask having the final layout pattern.

2. The method of claim 1, further comprising simulating multiple contours using multiple modified layout patterns and multiple modified target patterns within the constraints.

3. The method of claim 2, further comprising, selecting a final target pattern of the multiple modified target patterns and a final layout pattern within the multiple of modified layout patterns having a smallest difference between a simulated contour for the final layout pattern and the final target pattern.

4. The method of claim 3, further comprising, using the mask to fabricate an integrated circuit.

5. The method of claim 3, further comprising, rectangularizing the final target pattern.

6. The method of claim 1, wherein the constraints comprise edge placement error constraints.

7. The method of claim 6, wherein the edge placement error constraints are within a range of about 0.5 nanometers and 1.0 nanometers.

8. The method of claim 6, wherein the edge placement error constraints are asymmetrical.

9. The method of claim 1, wherein the constraints comprise line width constraints.

10. The method of claim 1, wherein the constraints comprise line spacing constraints.

11. A method performed by a computing system, the method comprising:
    receiving a layout pattern;
    receiving a target pattern associated with the layout pattern;
    receiving a set of constraints related to the target pattern;
    iteratively simulating contours of layout pattern variations across a target pattern space, the target pattern space comprising a variation of the target pattern within the constraints;
    selecting a final layout pattern and a final target pattern from the target pattern space; and
    fabricating a mask having the final layout pattern.

12. The method of claim 11, wherein a simulated contour of the final layout pattern has a minimal difference from the final target pattern across the target pattern space.

13. The method of claim 11, further comprising, using the mask to fabricate an integrated circuit.

14. The method of claim 11, wherein the constraints comprise edge placement error constraints.

15. The method of claim 11, wherein the constraints comprise line width constraints and line spacing constraints.

16. The method of claim 11, further comprising, rectangularizing the final target pattern.

17. The method of claim 11, further comprising, weighting differences between a simulated contour and a corresponding target pattern at various regions differently.

18. A system comprising:
    a processor; and
    a memory comprising machine readable instructions that when executed by the processor cause the system to:
      receive a layout pattern and a target pattern associated with the layout pattern;
      receive a set of constraints related to the target pattern, the constraints placing limits on target pattern variation;
      iteratively simulate contours of layout pattern variations across a target pattern space within the constraints; and
      select a final layout pattern and a final target pattern from the target pattern space, wherein a simulated contour of the final layout pattern has a minimal difference from the final target pattern across the target pattern space.

19. The system of claim 18, wherein the constraints comprise at least one of: edge placement error constraints, line width constraints, and line spacing constraints.

20. The system of claim 18, wherein the edge placement constraints are asymmetrical.

* * * * *